United States Patent
Bains et al.

(10) Patent No.: US 10,503,435 B2
(45) Date of Patent: Dec. 10, 2019

(54) PROVIDING EXTENDED DYNAMIC RANDOM ACCESS MEMORY (DRAM) BURST LENGTHS IN PROCESSOR-BASED SYSTEMS

(71) Applicant: QUALCOMM Incorporated, San Diego, CA (US)

(72) Inventors: Kuljit Singh Bains, DuPont, WA (US); Wesley Queen, Raleigh, NC (US); Liyong Wang, Cary, NC (US)

(73) Assignee: Qualcomm Incorporated, San Diego, CA (US)

(*) Notice: Subject to any disclaimer, the term of this patent is extended or adjusted under 35 U.S.C. 154(b) by 0 days.

(21) Appl. No.: 15/825,724

(22) Filed: Nov. 29, 2017

(65) Prior Publication Data

US 2018/0157441 A1   Jun. 7, 2018

Related U.S. Application Data

(60) Provisional application No. 62/428,638, filed on Dec. 1, 2016.

(51) Int. Cl.
*G06F 3/06* (2006.01)
*G06F 11/10* (2006.01)
(Continued)

(52) U.S. Cl.
CPC ............ *G06F 3/0659* (2013.01); *G06F 3/064* (2013.01); *G06F 3/0604* (2013.01);
(Continued)

(58) Field of Classification Search
CPC ...... G06F 3/0659; G06F 3/0604; G06F 3/064; G06F 3/0673; G06F 11/1068;
(Continued)

(56) References Cited

U.S. PATENT DOCUMENTS 5,710,784 A * 1/1998 Kindred ................ H03M 13/37
375/262
8,335,894 B1 * 12/2012 Rajan ...................... G06F 12/00
711/154
(Continued)

FOREIGN PATENT DOCUMENTS

WO       2016048634 A1     3/2016

OTHER PUBLICATIONS

International Search Report and Written Opinion for PCT/US2017/063921, dated Mar. 9, 2018, 12 pages.
(Continued)

*Primary Examiner* — Kyle Vallecillo
(74) *Attorney, Agent, or Firm* — Withrow & Terranova, PLLC

(57) ABSTRACT

Providing extended dynamic random access memory (DRAM) burst lengths in processor-based systems is disclosed. In one aspect, a processor-based system includes a DRAM circuit (e.g., disposed on a common x4/x8 die) providing 4-bit-wide data access ("x4") and a 128-bit internal data prefetch. When operated in a x4 mode, the DRAM circuit is configured to provide an extended DRAM burst length of 32 bits ("BL32"). The DRAM circuit receives a memory read request from a memory controller communicatively coupled to the DRAM circuit, prefetches 128 bits of data, and returns all of the 128 bits of fetched data to the memory controller in response to the memory read request. In some aspects, the DRAM circuit may also receive a memory write command including 128 bits of write data from the memory controller, and write the 128 bits of write data to memory without performing a read/modify/write (RMW) operation.

10 Claims, 3 Drawing Sheets

(51) Int. Cl.
*G11C 29/52* (2006.01)
*G06F 13/16* (2006.01)
*G06F 13/28* (2006.01)
*G11C 11/4063* (2006.01)

(52) U.S. Cl.
CPC ........ *G06F 3/0673* (2013.01); *G06F 11/1068* (2013.01); *G06F 13/1678* (2013.01); *G06F 13/28* (2013.01); *G11C 29/52* (2013.01); *G11C 11/4063* (2013.01); *Y02D 10/14* (2018.01)

(58) Field of Classification Search
CPC ..... G06F 13/1678; G06F 13/28; G11C 29/52; G11C 11/4063
See application file for complete search history.

(56) References Cited

U.S. PATENT DOCUMENTS

| | | | |
|---|---|---|---|
| 8,438,357 | B1 | 5/2013 | Elkins et al. |
| 9,704,563 | B2 | 7/2017 | Bains et al. |
| 2003/0182513 | A1 | 9/2003 | Dodd et al. |
| 2008/0086577 | A1 | 4/2008 | Huang |
| 2009/0063731 | A1 | 3/2009 | Gower et al. |
| 2010/0008166 | A1* | 1/2010 | Kim .................. G11C 7/02 365/189.16 |
| 2010/0077267 | A1* | 3/2010 | Perego ............... G06F 13/1678 714/716 |
| 2014/0192583 | A1* | 7/2014 | Rajan .................. G11C 7/10 365/63 |
| 2014/0325105 | A1* | 10/2014 | Prete ................. G06F 13/1642 710/112 |
| 2014/0355359 | A1* | 12/2014 | Linam ................. G11C 7/222 365/189.02 |
| 2015/0213859 | A1* | 7/2015 | Jang .................. G11C 7/22 365/194 |
| 2016/0092307 | A1* | 3/2016 | Bonen ............... G06F 11/1004 714/764 |
| 2016/0092383 | A1 | 3/2016 | Bains et al. |
| 2016/0163376 | A1* | 6/2016 | Bains ................. G11C 11/4093 365/189.05 |
| 2016/0342539 | A1* | 11/2016 | Bains .................. G06F 13/16 |
| 2016/0351234 | A1 | 12/2016 | Perego et al. |
| 2017/0147431 | A1 | 5/2017 | West et al. |
| 2018/0046541 | A1* | 2/2018 | Niu .................. G06F 11/1068 |

OTHER PUBLICATIONS

Second Written Opinion for PCT/US2017/063921, dated Nov. 5, 2018, 6 pages.
International Preliminary Report on Patentability for PCT/US2017/063921, dated Mar. 5, 2019, 18 pages.

* cited by examiner

PROVIDING EXTENDED DYNAMIC RANDOM ACCESS MEMORY (DRAM) BURST LENGTHS IN PROCESSOR-BASED SYSTEMS

PRIORITY CLAIM

The present application claims priority under 35 U.S.C. § 119(e) to U.S. Provisional Patent Application Ser. No. 62/428,638 filed on Dec. 1, 2016 and entitled "PROVIDING EXTENDED DYNAMIC RANDOM ACCESS MEMORY (DRAM) BURST LENGTHS IN PROCESSOR-BASED SYSTEMS," the contents of which is incorporated herein by reference in its entirety.

BACKGROUND

I. Field of the Disclosure

The technology of the disclosure relates generally to memory systems for processor-based systems, and, in particular, to memory burst lengths in dynamic random access memory (DRAM).

II. Background

Dynamic random access memory (DRAM) is a common form of computer memory in which individual bits of data are stored using a pair comprised of one transistor and one capacitor within a memory circuit. Double data rate (DDR) memory is a class of DRAM that provides higher data transfer rates by enabling data transfer on both the rising and falling edges of a clock signal, thus doubling data bus bandwidth at a given clock frequency. The Joint Electron Device Engineering Council (JEDEC) has developed specifications for multiple generations of DDR memory, including DDR1, DDR2, DDR3, and DDR4, with the specification for DDR5 forthcoming.

A DRAM circuit may be implemented using a common die that provides four (4) or eight (8) data pins (referred to herein as "x4" or "4-bit-wide" and "x8" or "8-bit-wide," respectively) for input and output. The amount of data that can be transferred into and out of the DRAM circuit is a function of the number of data pins in use and the "burst length" of the DRAM circuit. As used herein, "burst length" refers to the number of bits of data that may be transmitted as a single unit of transmission (a "burst") via each data pin. Thus, for example, a x4 DRAM circuit with a DRAM burst length of 16 (BL16) may transfer 64 bits of data at a time (i.e., 16 bits of data for each of the four (4) data pins), while a x8 DRAM circuit with BL16 may transfer 128 bits of data at a time (i.e., 16 bits of data for each of the eight (8) data pins).

Because a common die may be used to implement both x4 and x8 DRAM circuits, a DRAM circuit based on the common die may be configured to perform prefetches of 128 bits of data internally for all external reads and writes, regardless of the number of bits that may actually be transmitted in a single memory operation. This may provide optimal performance for x8 DRAM circuits with BL16, but may result in less efficient performance and power consumption for x4 DRAM circuits using BL16. For instance, a memory read operation for a x4 DRAM circuit requires the DRAM circuit to fetch 128 bits of data, correct any single bit errors using error correction code (ECC), provide a 64-bit subset of the fetched data to a memory controller, and discard the other 64 bits of fetched data. For memory write operations, only 64 bits of write data is received by the DRAM circuit to write to memory. However, the DRAM circuit must still internally fetch 128 bits of data, perform error correction, merge the 64 bits of write data into the 128 bits of fetched data, recompute the ECC for the 128 bits of data, and finally write all of the data back to memory. This series of operations requires a read/modify/write (RMW) operation to be performed by the DRAM circuit, which may be expensive in terms of computational resources and power consumption. Thus, it is desirable to provide a more efficient mechanism for x4 DRAM circuit implemented on a common x4/x8 die to perform memory read and write operations.

SUMMARY OF THE DISCLOSURE

Aspects disclosed in the detailed description include providing extended dynamic random access memory (DRAM) burst lengths in processor-based systems. In this regard, in one aspect, a processor-based system includes a DRAM circuit (e.g., disposed on a common x4/x8 die) that provides 4-bit-wide data access and a 128-bit internal data prefetch. When operated in a x4 mode, the DRAM circuit is configured to provide an extended DRAM burst length of 32 bits (BL32). The DRAM circuit receives a memory read request from a memory controller that is communicatively coupled to the DRAM circuit. The DRAM circuit is configured to prefetch 128 bits of data, and then return all of the 128 bits of fetched data to the memory controller in response to the memory read request. In some aspects, the DRAM circuit may also receive a memory write command including 128 bits of write data from the memory controller, and may write the 128 bits of write data to memory without performing a read/modify/write (RMW) operation. Some aspects may provide that the BL32 mode of the DRAM circuit is dynamically selectable by the memory controller, such as by setting or clearing a bit in read and write commands to toggle between BL16 or BL32. In some aspects, a mode register of one or more mode registers provided by the DRAM circuit is configured to enable a mode for selecting BL16 or BL32 on-the-fly.

In another aspect, a processor-based system for providing extended DRAM burst lengths is provided. The processor-based system comprises a DRAM circuit configured to provide 4-bit-wide data access and a 128-bit internal data prefetch. The processor-based system further comprises a memory controller communicatively coupled to the DRAM circuit. The DRAM circuit configured to provide an extended DRAM burst length of 32 bits by being configured to receive, from the memory controller, a memory read request. The DRAM circuit is further configured to perform an internal prefetch of 128 bits of data. The DRAM circuit is configured to generate an error correction code (ECC) over all of the 128 bits of data. The DRAM circuit is also configured to return all of the 128 bits of data to the memory controller, responsive to the memory read request.

In another aspect, a method for providing extended DRAM burst lengths is provided. The method comprises receiving, by a DRAM circuit configured to provide 4-bit-wide data access and a 128-bit internal data prefetch, a memory read request from a memory controller. The method further comprises performing an internal prefetch of 128 bits of data, and generating an ECC over all of the 128 bits of data. The method also comprises returning, by the DRAM circuit, all of the 128 bits of data to the memory controller, responsive to the memory read request.

In another aspect, a processor-based system for providing extended DRAM burst lengths for DRAM using 4-bit-wide data access. The processor-based system comprises a means for receiving a memory read request from a memory controller. The processor-based system further comprises a means for performing an internal prefetch of 128 bits of data, and a means for generating an ECC over all of the 128 bits of data. The processor-based system also comprises a means for returning all of the 128 bits of data to the memory controller, responsive to the memory read request.

DETAILED DESCRIPTION

Figure 1:
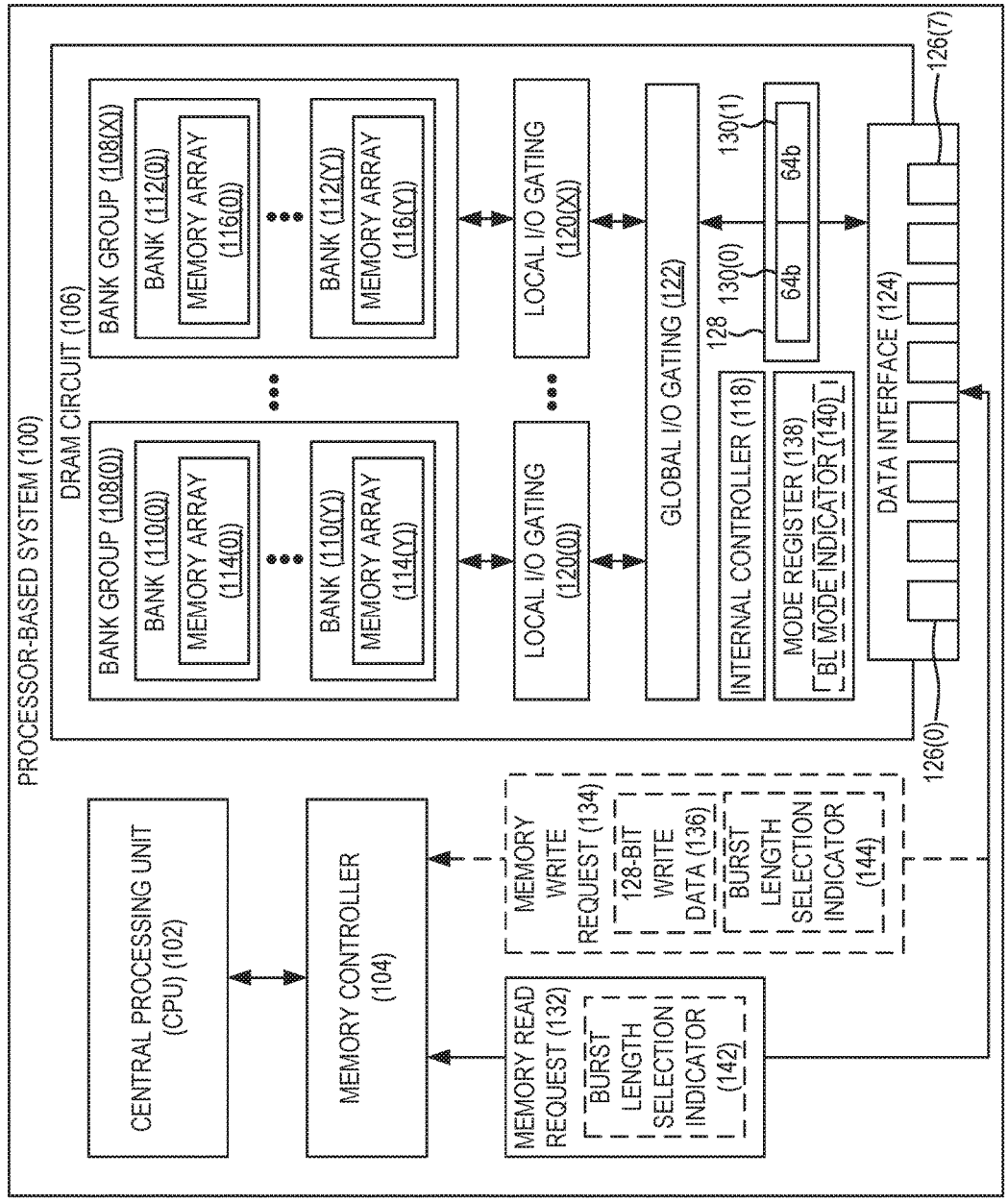
FIG. 1 is a block diagram of an exemplary processor-based system including a memory controller and a dynamic random access memory (DRAM) circuit configured to provide extended DRAM burst lengths.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include providing extended dynamic random access memory (DRAM) burst lengths in processor-based systems. Accordingly, in this regard, FIG. 1 illustrates an exemplary processor-based system 100 that includes a central processing unit (CPU) 102, a memory controller 104, and a DRAM circuit 106 for performing memory operations using an extended DRAM burst length of 32 bits (i.e., "BL32"). In some aspects, the memory controller 104 is provided on a separate semiconductor die from a semiconductor die containing the CPU 102, while some aspects provide that the memory controller 104 is provided on a same semiconductor die as the CPU 102. Regardless of the die configurations, the memory controller 104 is provided such that the CPU 102 may make memory access requests via an internal system bus to the memory controller 104, and receive data from memory through the memory controller 104.

The processor-based system 100 of FIG. 1 may encompass any one of known digital logic elements, semiconductor circuits, processing cores, and/or memory structures, among other elements, or combinations thereof. Aspects described herein are not restricted to any particular arrangement of elements, and the disclosed techniques may be easily extended to various structures and layouts on semiconductor dies or packages. It is to be understood that some aspects of the processor-based system 100 may include elements in addition to those illustrated in FIG. 1.

As seen in FIG. 1, the DRAM circuit 106 is organized into a plurality of bank groups 108(0)-108(X), each made up of a plurality of banks 110(0)-110(Y), 112(0)-112(Y). Each of the plurality of banks 110(0)-110(Y), 112(0)-112(Y) includes a corresponding memory array 114(0)-114(Y), 116(0)-116(Y). Memory access to each of the bank groups 108(0)-108(X) may be controlled by an internal controller 118 using local input/output (I/O) gating 120(0)-120(X) and global I/O gating 122. It is to be understood that, in some aspects, the DRAM circuit 106 may contain more or fewer of the bank groups 108(0)-108(X), the banks 110(0)-110(Y), 112(0)-112(Y), the memory arrays 114(0)-114(Y), 116(0)-116(Y), and/or the local input/output (I/O) gating 120(0)-120(X) than illustrated in FIG. 1.

To communicate with the memory controller 104, the DRAM circuit 106 provides a data interface 124. In the example of FIG. 1, the data interface 124 provides a total of eight (8) data pins 126(0)-126(7). Some aspects of the DRAM circuit 106 may employ all eight (8) data pins 126(0)-126(7) (i.e., a "x8" or "8-bit-wide" configuration) to transmit data to and receive data from the memory controller 104. In such aspects using a DRAM burst length of 16 (i.e., "BL16"), the DRAM circuit 106 may be configured to provide a 128-bit internal prefetch, and thus may read and write 128 bits of data, as represented by a unit 128, during each memory access operation.

However, some aspects of the DRAM circuit 106 may be configured to use only four (4) of the data pins 126(0)-126(7) (i.e., a "x4" or "4-bit-wide" configuration). When performing memory read operations in such aspects using BL16, the DRAM circuit 106 may retrieve the unit 128 containing 128 bits of data, but may only transmit 64 bits of data, such as one of units 130(0), 130(1), to the memory controller 104. This results in a waste of memory bandwidth, computation resources, and power. Similarly, to write 64 bits of data to memory, the DRAM circuit 104 may perform a read/modify/write (RMW) operation to fetch the unit 128 containing 128 bits of data, update it with the 64 bits of new data to be written (e.g., one of the units 130(0), 130(1)), and write the data. Such a RMW operation may be expensive in terms of computational resources and power consumption.

Accordingly, aspects of the DRAM circuit 106 of FIG. 1 are configured to provide an extended DRAM burst length of 32 (i.e., "BL32") when operating in a x4 configuration. In such aspects, the DRAM circuit 106 may receive a memory read request 132 from the memory controller 104. The memory controller 104, being configured to be aware of the BL32 extended DRAM burst length, expects to receive 128 bits of data per burst in response to the memory read request 132. The DRAM circuit 106 thus fetches the unit 128 of 128 bits of data, generates an error correction code (ECC) over all of the 128 bits of data, and returns all of the 128 bits of data to the memory controller 104 in response to the memory read request 132.

For memory write operations, aspects of the DRAM circuit 106 receive a memory write request 134, including 128-bit write data 136. Upon receiving the write data 136, the DRAM circuit 106 is configured to write the write data 136 without performing a RMW operation. In some aspects, the DRAM circuit 106 may be configured to generate an ECC and/or perform error correction on the write data 136 as part of the memory write operation.

According to some aspects, the DRAM circuit 106 may be configured to enable "on-the-fly" selection of the burst length (i.e., allowing the burst length to be used for memory read and write operations to be modified during the course of normal operation of the DRAM circuit 106). In some such aspects, a mode register 138 of the DRAM circuit 106 provides a burst length mode indicator ("BL MODE INDICATOR") 140 that indicates whether on-the-fly burst length selection is enabled. It is to be understood that the mode register 138 of FIG. 1 may be one of a plurality of mode registers provided by the DRAM circuit 106. An on-the-fly burst length selection mode (e.g., indicating whether on-the-fly burst length selection is allowed) is enabled by the DRAM circuit 106 when the burst length mode indicator 140 is in a set state, and disabled when the burst length mode indicator 140 is not in a set state. According to some aspects, the burst length mode indicator 140 may comprise a new bit added to the mode register 138, or may comprise an existing bit within the mode register 138 that is repurposed to indicate the on-the-fly burst length selection mode.

When the burst length mode indicator 140 is in a set state, the memory read request 132 and/or the memory write request 134 may include a burst length selection indicators 142 and 144, respectively, to indicate whether a BL16 or BL32 mode should be used by the DRAM circuit 106. For instance, the DRAM circuit 106 may be configured to perform a memory read operation or a memory write operation using a conventional BL16 mode if the corresponding burst length selection indicator 142 or 144 is not in a set state, and to operate in BL32 mode if the corresponding burst length selection indicator 142 or 144 is in a set state. This may enable the memory controller 104 to tailor the operations of the DRAM circuit 106 to optimize memory access operations for the selected burst length, and to allow different burst lengths to be used for different applications. In some aspects, the burst length selection indicator 142 and/or 144 may comprise a conventional burst chop (BC) indicator (not shown) within the memory read request 132 and/or the memory write request 134, respectively, that is repurposed as the burst length selection indicator 142 and/or 144.

Figure 2:
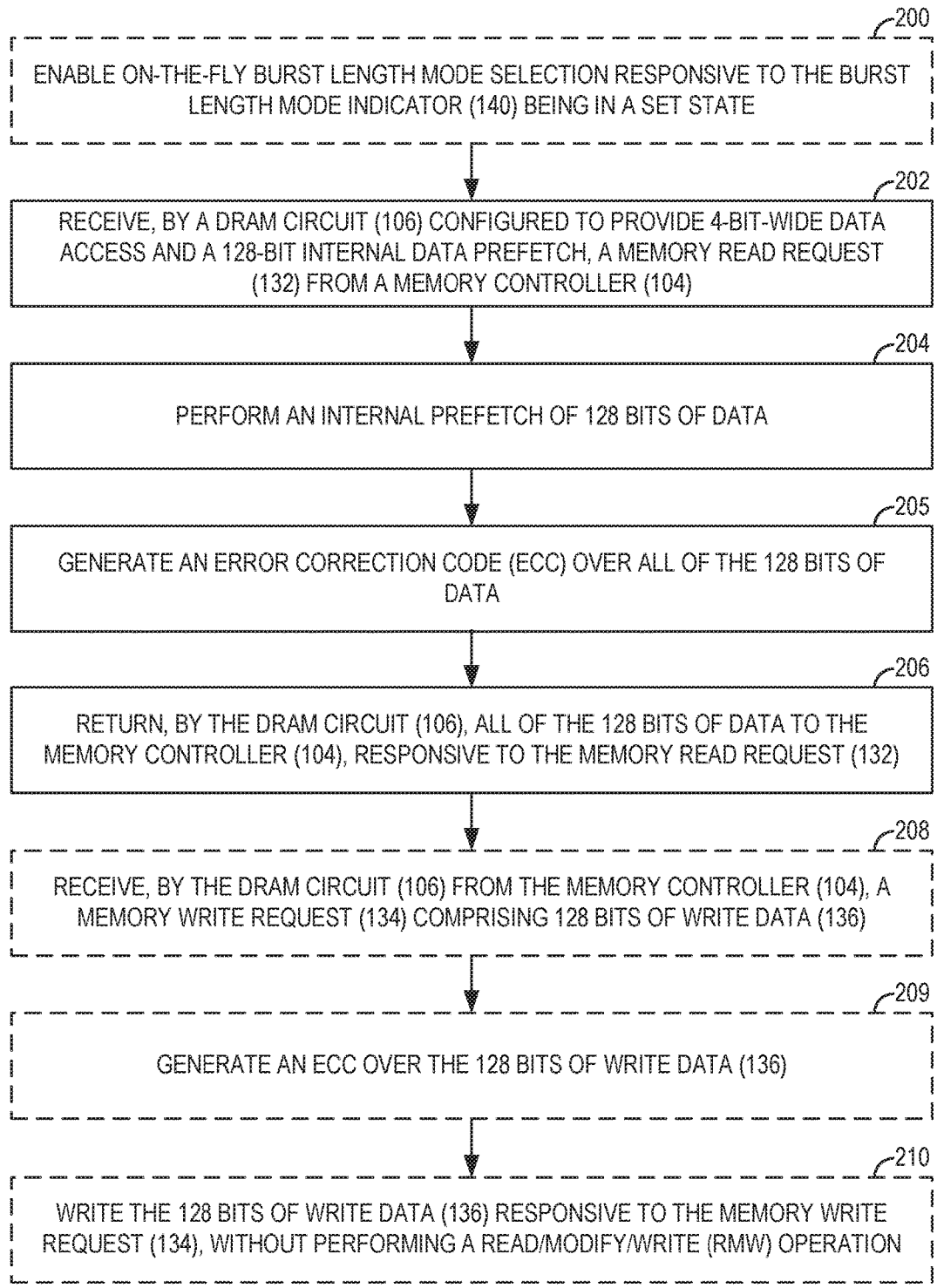
FIG. 2 is a flowchart illustrating an exemplary process for providing extended DRAM burst lengths using the memory controller and the DRAM circuit of FIG. 1.

FIG. 2 illustrates exemplary operations of the memory controller 104 and the DRAM circuit 106 of FIG. 1 for providing extended DRAM burst lengths. For the sake of clarity, elements of FIG. 1 are referenced in describing FIG. 2. In FIG. 2, operations begin with the DRAM circuit 106 receiving, from the memory controller 104, a memory read request 122 (block 200). The DRAM circuit 106 fetches 128 bits of data (block 202). The DRAM circuit 106 then returns all of the 128 bits of data to the memory controller 104, responsive to the memory read request 122 (block 204). In some aspects, the DRAM circuit 106 may also receive a memory write request 124 comprising 128 bits of write data 126 from the memory controller 104 (block 206). The DRAM circuit 106 may then write the 128 bits of write data 126 without performing a RMW operation, responsive to the memory write request 124 (block 208).

FIG. 2 illustrates exemplary operations of the memory controller 104 and the DRAM circuit 106 of FIG. 1 for providing extended DRAM burst lengths. For the sake of clarity, elements of FIG. 1 are referenced in describing FIG. 2. In some aspects, the operations illustrated in FIG. 2 begin with the DRAM circuit 106 enabling on-the-fly burst length mode selection responsive to the burst length mode indicator 140 being in a set state (block 200). In this regard, the DRAM circuit 106 may be referred to herein as "a means for enabling on-the-fly burst length mode selection responsive to the burst length mode indicator being in a set state." The DRAM circuit 106 next receives the memory read request 132 from the memory controller 104 (block 202). Accordingly, the DRAM circuit 106 may be referred to herein as "a means for receiving a memory read request from a memory controller."

The DRAM circuit 106 performs an internal prefetch of 128 bits of data (block 204). The DRAM circuit 106 thus may be referred to herein as "a means for performing an internal prefetch of 128 bits of data." The DRAM circuit 106 generates an ECC over all of the 128 bits of data (block 205). Accordingly, the DRAM circuit 106 may be referred to herein as "a means for generating an error correction code (ECC) over all of the 128 bits of data." The DRAM circuit 106 then returns all of the 128 bits of data to the memory controller 104, responsive to the memory read request 132 (block 206). In this regard, the DRAM circuit 106 may be referred to herein as "a means for returning all of the 128 bits of data to the memory controller, responsive to the memory read request." In some aspects, operations of block 206 for returning the 128 bits of data to the memory controller 106 may be further responsive to detecting that the burst length selection indicator 142 of the memory read request 132 is in a set state. In such aspects, the DRAM circuit 106 may be referred to herein as "a means for returning all of the 128 bits of data further responsive to detecting that the burst length selection indicator of the memory read request is in a set state."

According to some aspects, the DRAM circuit 106 may also receive a memory write request 134 comprising 128 bits of write data 136 from the memory controller 104 (block 208). Accordingly, the DRAM circuit 106 may be referred to herein as "a means for receiving a memory write request comprising 128 bits of write data." The DRAM circuit 106 in such aspects generates an ECC over the 128 bits of write data 136 (block 209). In this regard, the DRAM circuit 106 may be referred to herein as "a means for generating an ECC over the 128 bits of write data." The DRAM circuit 106 then writes the 128 bits of write data 136 responsive to the memory write request 134, without performing a read/modify/write (RMW) operation (block 210). The DRAM circuit 106 thus may be referred to herein as "a means for writing the 128 bits of write data responsive to the memory write request, without performing a read/modify/write (RMW) operation." Some aspects may provide that the operations of block 210 for writing the 128 bits of write data 136 are further responsive to detecting that the burst length selection indicator 144 of the memory write request 134 is in a set state. In these aspects, the DRAM circuit 106 may be referred to herein as "a means for writing the 128 bits of write data further responsive to detecting that the burst length selection indicator of the memory write request is in a set state."

Providing extended DRAM burst lengths in processor-based systems according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 3:
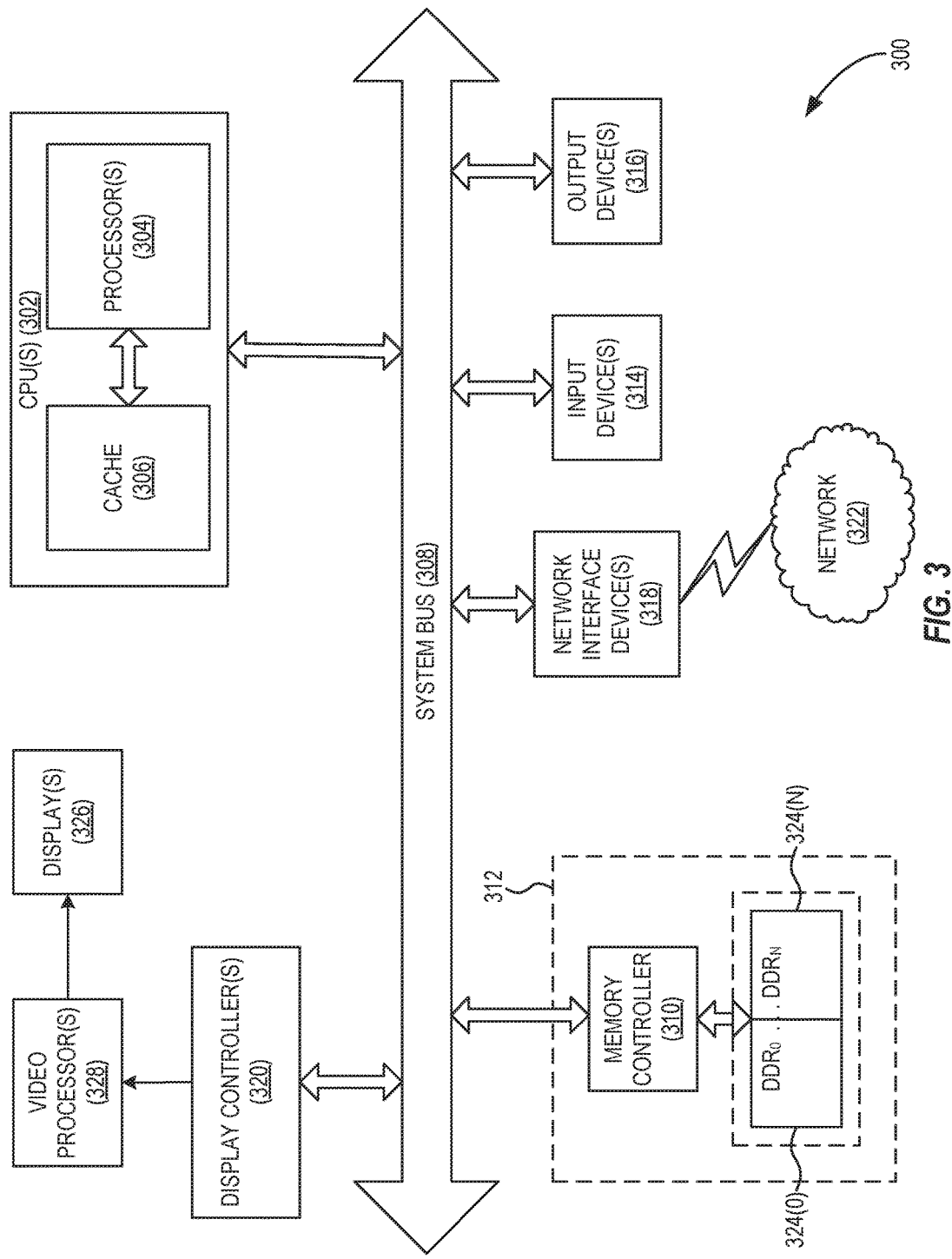
FIG. 3 is a block diagram of an exemplary processor-based system that can include the memory controller and the DRAM circuit of FIG. 1.

In this regard, FIG. 3 illustrates an example of a processor-based system 300 that can employ the memory controller 104 and the DRAM circuit 106 illustrated in FIG. 1. The processor-based system 300 includes one or more CPUs 302, each including one or more processors 304. The CPU(s) 302 may have cache memory 306 coupled to the processor(s) 304 for rapid access to temporarily stored data, and in some aspects may correspond to the CPU 102 of FIG. 1. The CPU(s) 302 is coupled to a system bus 308 and can intercouple master and slave devices included in the processor-based system 300. As is well known, the CPU(s) 302 communicates with these other devices by exchanging address, control, and data information over the system bus 308. For example, the CPU(s) 302 can communicate bus transaction requests to a memory controller 310 as an example of a slave device. According to some aspects, the memory controller 310 may correspond to the memory controller 104 of FIG. 1.

Other master and slave devices can be connected to the system bus 308. As illustrated in FIG. 3, these devices can include a memory system 312, one or more input devices 314, one or more output devices 316, one or more network interface devices 318, and one or more display controllers 320, as examples. The input device(s) 314 can include any type of input device, including but not limited to input keys, switches, voice processors, etc. The output device(s) 316 can include any type of output device, including, but not limited to, audio, video, other visual indicators, etc. The network interface device(s) 318 can be any devices configured to allow exchange of data to and from a network 322. The network 322 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 318 can be configured to support any type of communications protocol desired. The memory system 312 can include one or more memory units 324(0)-324(N). In some aspects, the DRAM circuit 106 of FIG. 1 may correspond to each of the one or more memory units 324(0)-324(N) of FIG. 3.

The CPU(s) 302 may also be configured to access the display controller(s) 320 over the system bus 308 to control information sent to one or more displays 326. The display controller(s) 320 sends information to the display(s) 326 to be displayed via one or more video processors 328, which process the information to be displayed into a format suitable for the display(s) 326. The display(s) 326 can include any type of display, including, but not limited to, a cathode ray tube (CRT), a liquid crystal display (LCD), a plasma display, etc.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master devices, and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A processor-based system for providing extended dynamic random access memory (DRAM) burst lengths, comprising:
   a DRAM circuit configured to provide 4-bit-wide data access and a 128-bit internal data prefetch; and a memory controller communicatively coupled to the DRAM circuit;

the DRAM circuit configured to provide an extended DRAM burst length of 32 bits by being configured to:
receive, from the memory controller, a memory read request;
perform an internal prefetch of 128 bits of data;
generate an error correction code (ECC) over all of the 128 bits of data; and
return all of the 128 bits of data to the memory controller, responsive to the memory read request;

wherein:
the memory read request comprises a burst length selection indicator;
the DRAM circuit is configured to provide the extended DRAM burst length of 32 bits responsive to detecting that the burst length selection indicator of the memory read request is in a set state; and
the burst length selection indicator comprises a burst chop (BC) indicator of the memory read request that is repurposed as the burst length selection indicator.

2. The processor-based system of claim 1, wherein:
the DRAM circuit comprises a mode register comprising a burst length mode indicator; and
the DRAM circuit is configured to enable on-the-fly burst length mode selection responsive to the burst length mode indicator being in a set state.

3. A processor-based system for providing extended dynamic random access memory (DRAM) burst lengths, comprising:
a DRAM circuit configured to provide 4-bit-wide data access and a 128-bit internal data prefetch; and
a memory controller communicatively coupled to the DRAM circuit;
the DRAM circuit configured to provide an extended DRAM burst length of 32 bits by being configured to:
receive, from the memory controller, a memory read request;
perform an internal prefetch of 128 bits of data;
generate an error correction code (ECC) over all of the 128 bits of data; and
return all of the 128 bits of data to the memory controller, responsive to the memory read request:

wherein:
the DRAM circuit is further configured to:
receive, from the memory controller, a memory write request comprising 128 bits of write data;
generate an ECC over the 128 bits of write data; and
write the 128 bits of write data responsive to the memory write request, without performing a read/modify/write (RMW) operation;
the memory write request comprises a burst length selection indicator;
the DRAM circuit is configured to provide the extended DRAM burst length of 32 bits responsive to detecting that the burst length selection indicator of the memory write request is in a set state; and
the burst length selection indicator comprises a burst chop (BC) indicator of the memory write request that is repurposed as the burst length selection indicator.

4. The processor-based system of claim 1 integrated into an integrated circuit (IC).

5. The processor-based system of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

6. A method for providing extended dynamic random access memory (DRAM) burst lengths, comprising:
receiving, by a DRAM circuit configured to provide 4-bit-wide data access and a 128-bit internal data prefetch, a memory read request from a memory controller;
performing an internal prefetch of 128 bits of data;
generating an error correction code (ECC) over all of the 128 bits of data; and
returning, by the DRAM circuit, all of the 128 bits of data to the memory controller, responsive to the memory read request;

wherein:
the memory read request comprises a burst length selection indicator;
returning, by the DRAM circuit, all of the 128 bits of data to the memory controller is further responsive to detecting that the burst length selection indicator of the memory read request is in a set state; and
the burst length selection indicator comprises a burst chop (BC) indicator of the memory read request that is repurposed as the burst length selection indicator.

7. The method of claim 6, wherein:
the DRAM circuit comprises a mode register comprising a burst length mode indicator; and
the method further comprising enabling on-the-fly burst length mode selection responsive to the burst length mode indicator being in a set state.

8. The method of claim 6, further comprising:
receiving, by the DRAM circuit from the memory controller, a memory write request comprising 128 bits of write data;
generating an ECC over the 128 bits of write data; and
writing the 128 bits of write data responsive to the memory write request, without performing a read/modify/write (RMW) operation.

9. The method of claim 8, wherein:
the memory write request comprises a burst length selection indicator; and
writing the 128 bits of write data is further responsive to detecting that the burst length selection indicator of the memory write request is in a set state.

10. The method of claim 9, wherein the burst length selection indicator comprises a burst chop (BC) indicator of the memory write request that is repurposed as the burst length selection indicator.

* * * * *